United States Patent
Su et al.

(10) Patent No.: US 7,335,553 B2
(45) Date of Patent: Feb. 26, 2008

(54) METHOD FOR FORMING TRENCH CAPACITOR AND MEMORY CELL

(75) Inventors: Yi-Nan Su, Tao-Yuan (TW); Jun-Chi Huang, Tai-Chung Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 11/162,563

(22) Filed: Sep. 14, 2005

(65) Prior Publication Data

US 2007/0057303 A1 Mar. 15, 2007

(51) Int. Cl.
*H01L 21/8242* (2006.01)

(52) U.S. Cl. ............... 438/243; 438/386; 257/E29.346; 257/E21.396

(58) Field of Classification Search ........ 438/243–250, 438/386–391; 257/301–307, E27.092, E27.093, 257/E27.094, E27.095, E29.346, E21.396, 257/E21.651
See application file for complete search history.

(56) References Cited

U.S. PATENT DOCUMENTS 6,750,499 B2 * 6/2004 Wu ............................ 257/305
6,964,897 B2 * 11/2005 Bard et al. .................. 438/243

* cited by examiner

*Primary Examiner*—Brook Kebede
(74) *Attorney, Agent, or Firm*—Winston Hsu

(57) ABSTRACT

A method for forming a trench capacitor and memory cell by providing a substrate on which a grid STI and a plurality of active regions covered by a hard mask layer are formed. A photoresist is formed and a low grade photo mask having only X direction consideration is used to define the required pattern on the photoresist. The hard mask layer and the STI are used as an etching mask to etch a plurality of deep trenches. Then diffusion regions, capacitor dielectric layer, and polysilicon filled to form the capacitor bottom electrode are sequentially formed to complete the forming for trench capacitors. After removing the hard mask layer and performing a logic process, the memory cells are completed.

8 Claims, 18 Drawing Sheets

METHOD FOR FORMING TRENCH CAPACITOR AND MEMORY CELL

BACKGROUND OF THE INVENTION

1. Field of the Invention

The present invention relates to a method of forming trench capacitor and memory cell, and more particularly, to a method that uses a low grade photo mask to form the deep trench in the trench capacitor and the memory cell.

2. Description of the Prior Art

Dynamic Random Access Memory (DRAM) is an integrated circuit formed by many memory cells and a prominent volatile memory for the time being. As electrical products tend towards increasing miniaturization, DRAM devices need to have a high integration and density. Trench capacitor DRAM devices are popularly used for high density DRAM that is formed in a deep trench capacitor of the semiconductor substrate to effectively decrease the size of memory unit and efficiently utilize the space of the chip.

Please refer to FIGS. 1-3, wherein FIG. 1 is the plain view and FIGS. 2-3 are the schematic cross-sectional views illustrating the forming for trench capacitors in prior art. FIG. 2 is a cross-sectional diagram along the line 2-2' of the substrate shown in FIG. 1. As indicated, the conventional method for forming the trench capacitors 10 are firstly to form a patterned photoresist (not shown) on a silicon substrate 100 on which has a hard mask layer 104 defining the positions for a plurality of the trench capacitors 10. Then a photo mask pattern transferring process is performed to form a plurality of openings 102 in the hard mask layer 104 to define the plurality of the trench capacitors 10. The openings 102 in the hard mask layer 102 are used for etching a plurality of deep trenches in the silicon substrate 100. Then diffusion regions 106, a capacitor dielectric 108, and capacitor bottom electrodes 110 are sequentially formed to complete the forming of a trench capacitor. Additionally, the diffusion region 106 is used as the buried electrode in the trench capacitor 10.

Next, as shown in FIG. 3, by using the etching, deposition, chemical mechanical polish (CMP), ion implanting processes, a plurality of shallow trench isolations (STIs) 202 are formed in any two adjacent trench capacitors 10 along with the corresponding gates 204, spacers 206, and source/drain 208. At last an optional salicide process is performed. The trench capacitors 10 are electrically connected to other devices and metal interconnection by a plurality of contact plug (not shown).

However, the conventional method described above involves using a photo mask having a pattern to define the trench capacitor array in the photoresist and the hard mask as shown in FIG. 1. Then the substrate is etched to form the deep trenches according to the patterned transferred from the photo mask. And another photo mask having the pattern of STI array is required to form the STIs in any two adjacent capacitors. In other words, not only the two photo mask require for high density and accurate alignment in X direction and Y direction, which increases the possibility of fail in exposure, development, and etching process, but also the trench capacitors' electrical performance may be influenced because the diffusion region and the capacitor bottom electrode are easily damaged and contaminated during the etching, cleaning, CMP processes performed for forming STIs.

SUMMARY OF THE INVENTION

Therefore, the primary object of the present invention is to provide a method for forming trench capacitors and memory cells.

According to the present invention, a substrate is provided on which a grid shallow trench isolation (STI) and a plurality of active region covering by a hard mask layer are formed. Then forming a patterned photoresist to define the positions for each trench capacitor. After removing the photoresist, the hard mask layer and the STI are used as a mask to etch a plurality of deep trenches. Then diffusion regions and a capacitor dielectric layer are sequentially formed in the deep trenches. A polysilicon layer is filled in the deep trenches to form the capacitor bottom electrodes to complete the manufacturing of the trench capacitors. After that, the hard mask layer is removed and a plurality of gates and spacers are formed on the active region. A plurality of contact plugs is finally formed on the word lines to complete the manufacturing of DRAM memory cells.

What deserves to be mentioned is that according to the method provided by the present invention, the hard mask layer and the STI are used together as the mask in the etching process, therefore the photo mask needed in the present invention is a mask has no consideration in Y direction. That is to say, only a low grade photo mask is needed to define the trench capacitor array.

In addition, with the trend of semiconductor integration, many chips are having different kind of design simultaneously, such as System-on-Chips. And according to the method provided herein, it is much easier to perform the exposure process on SOC and further decreases the possibility of fail for the high-density photo mask pattern transferring in the exposure process.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
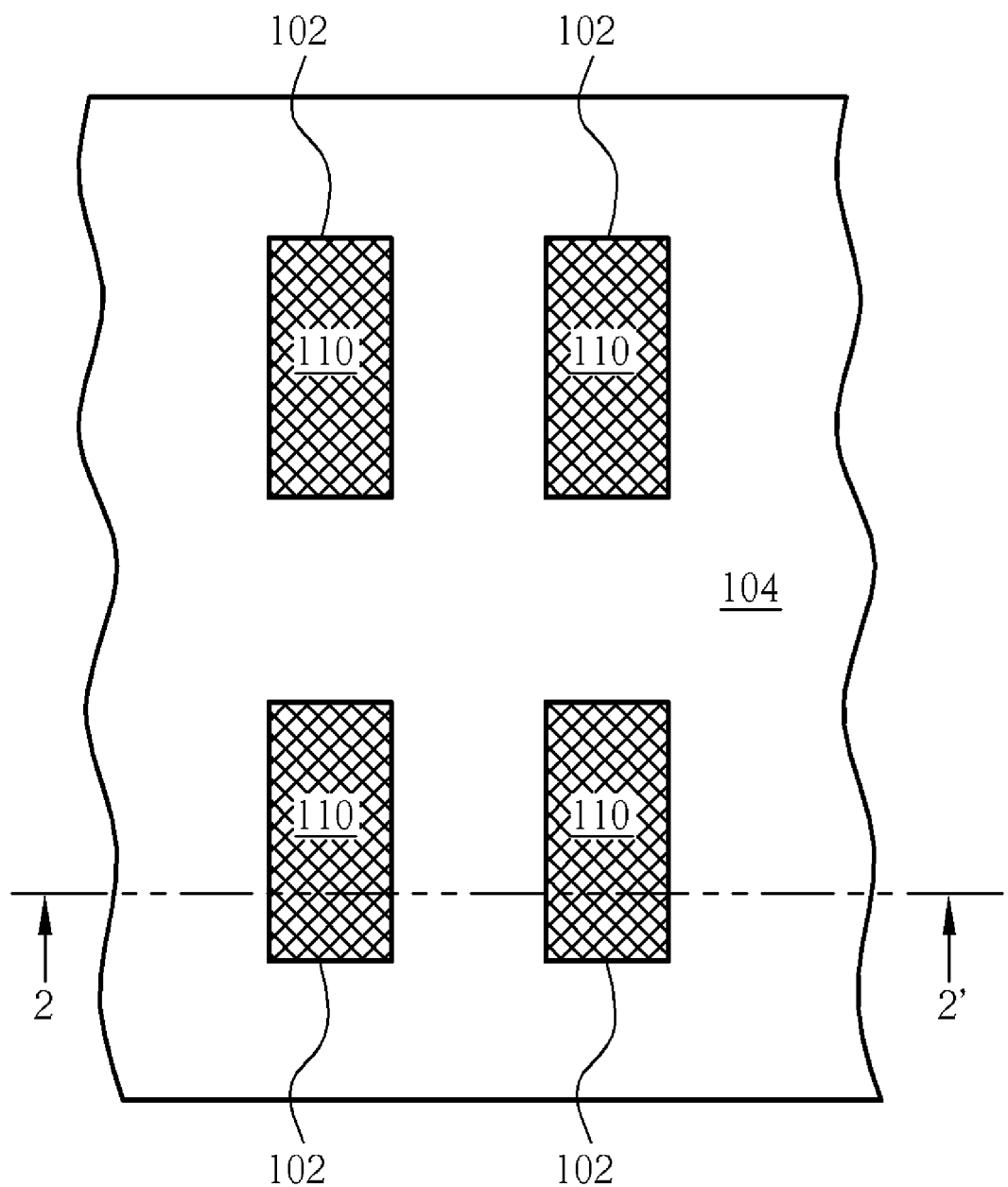
FIG. 1 is a plain view of a conventional trench capacitor array.
Figure 2:
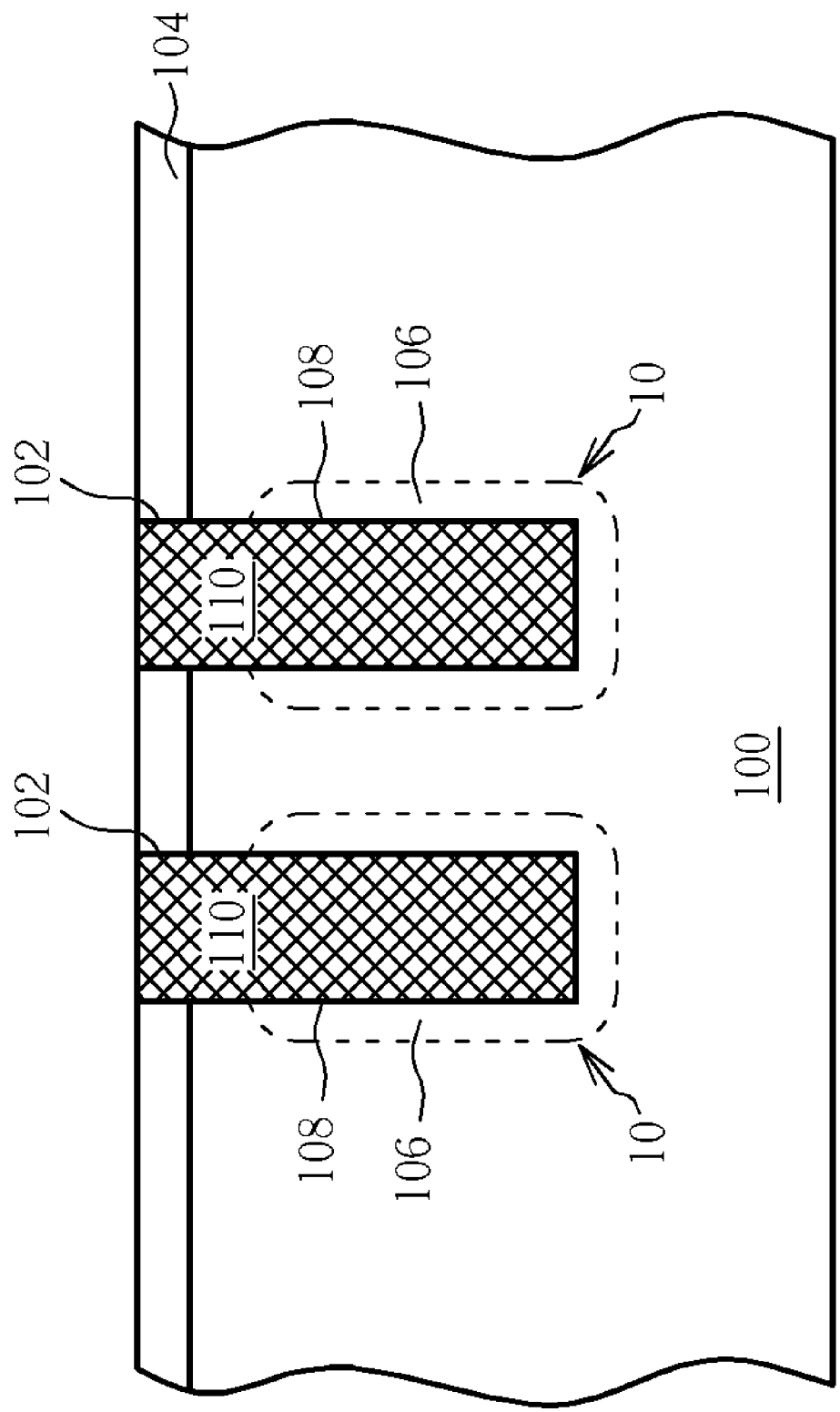
FIGS. 2-3 are cross-sectional views illustrating a substrate on which memory cells are formed.
Figure 3:
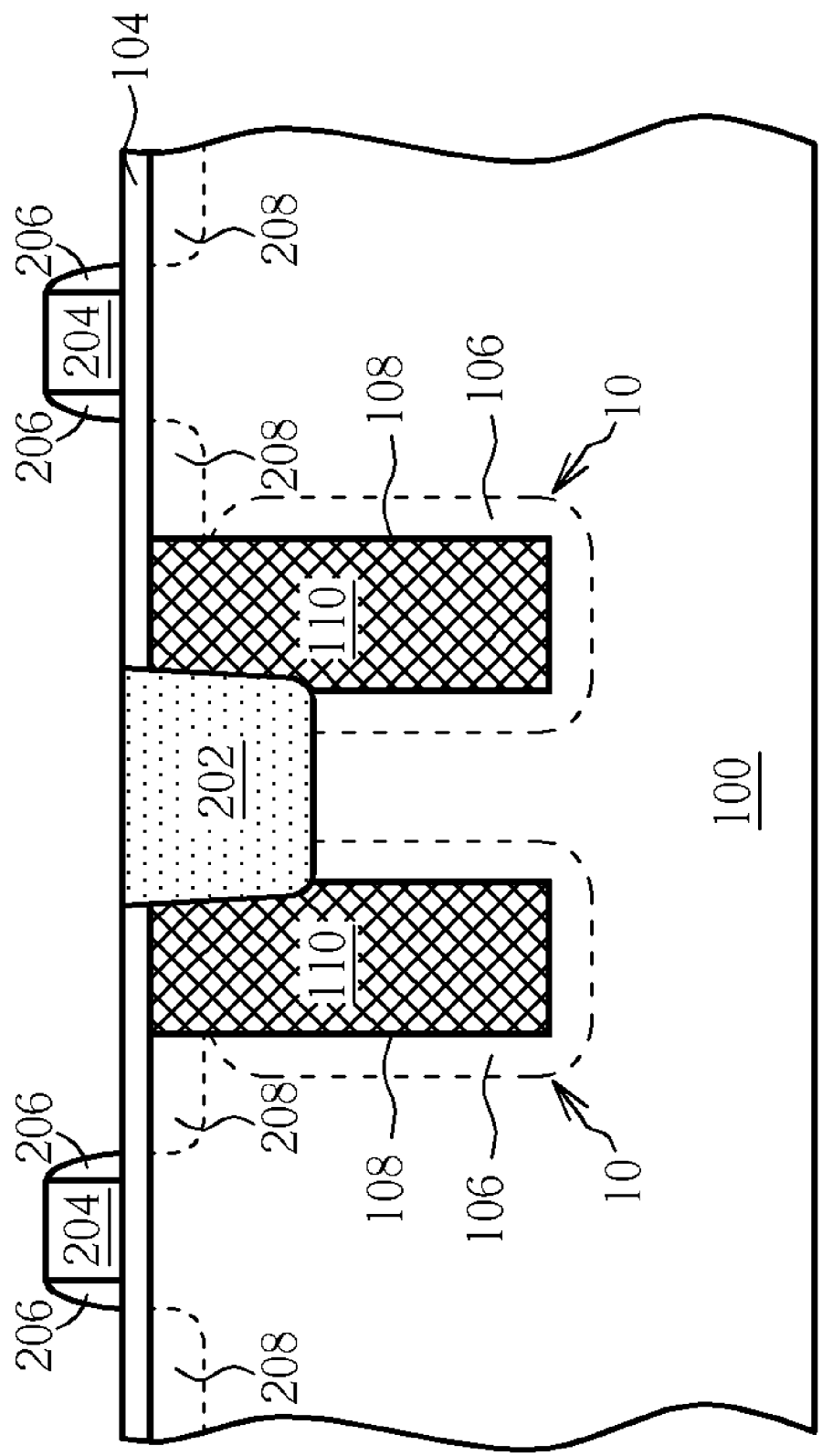
Figure 4:
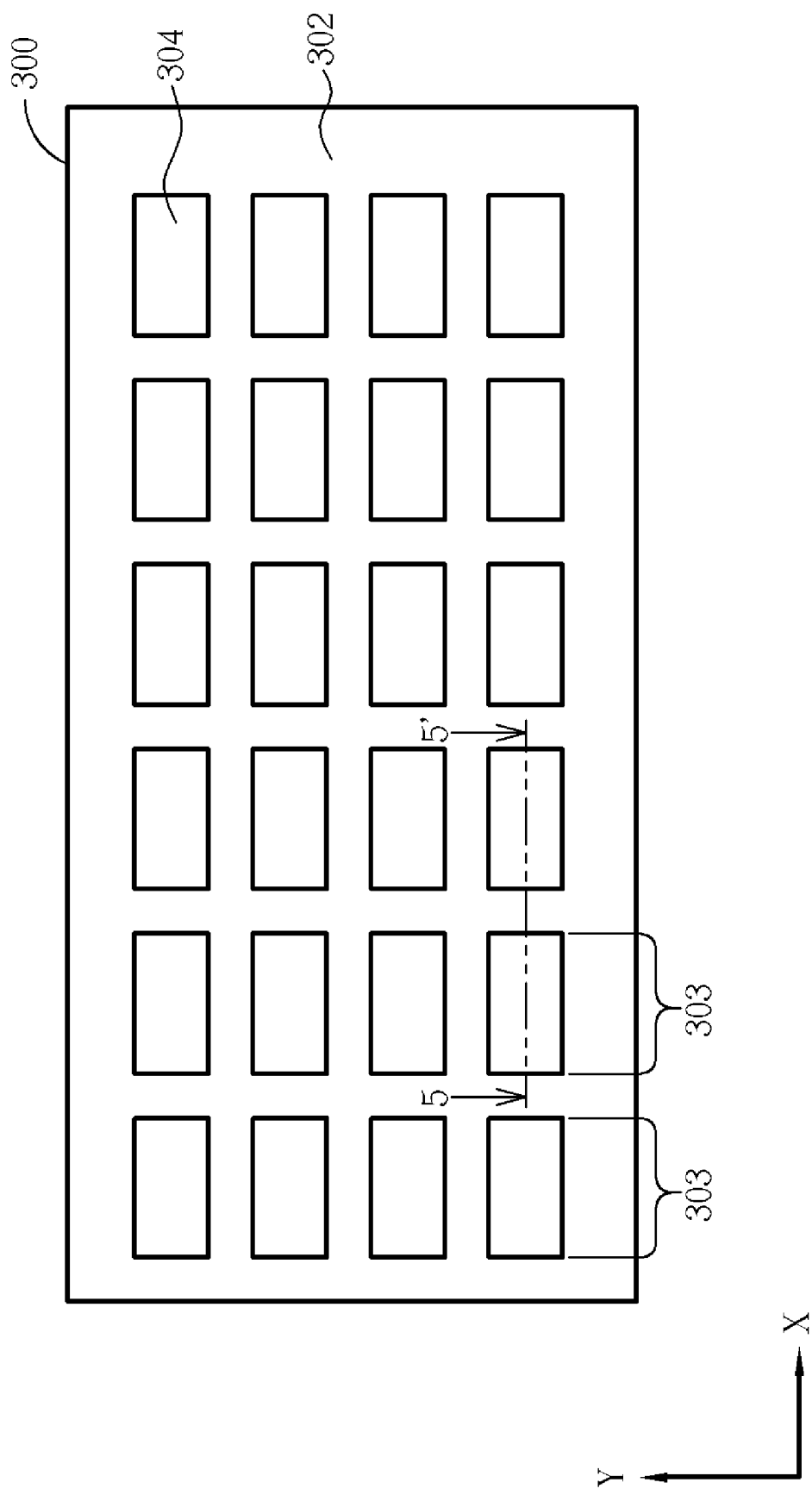
FIG. 4 is a plain view of a trench capacitor array in the present invention.
Figure 5:
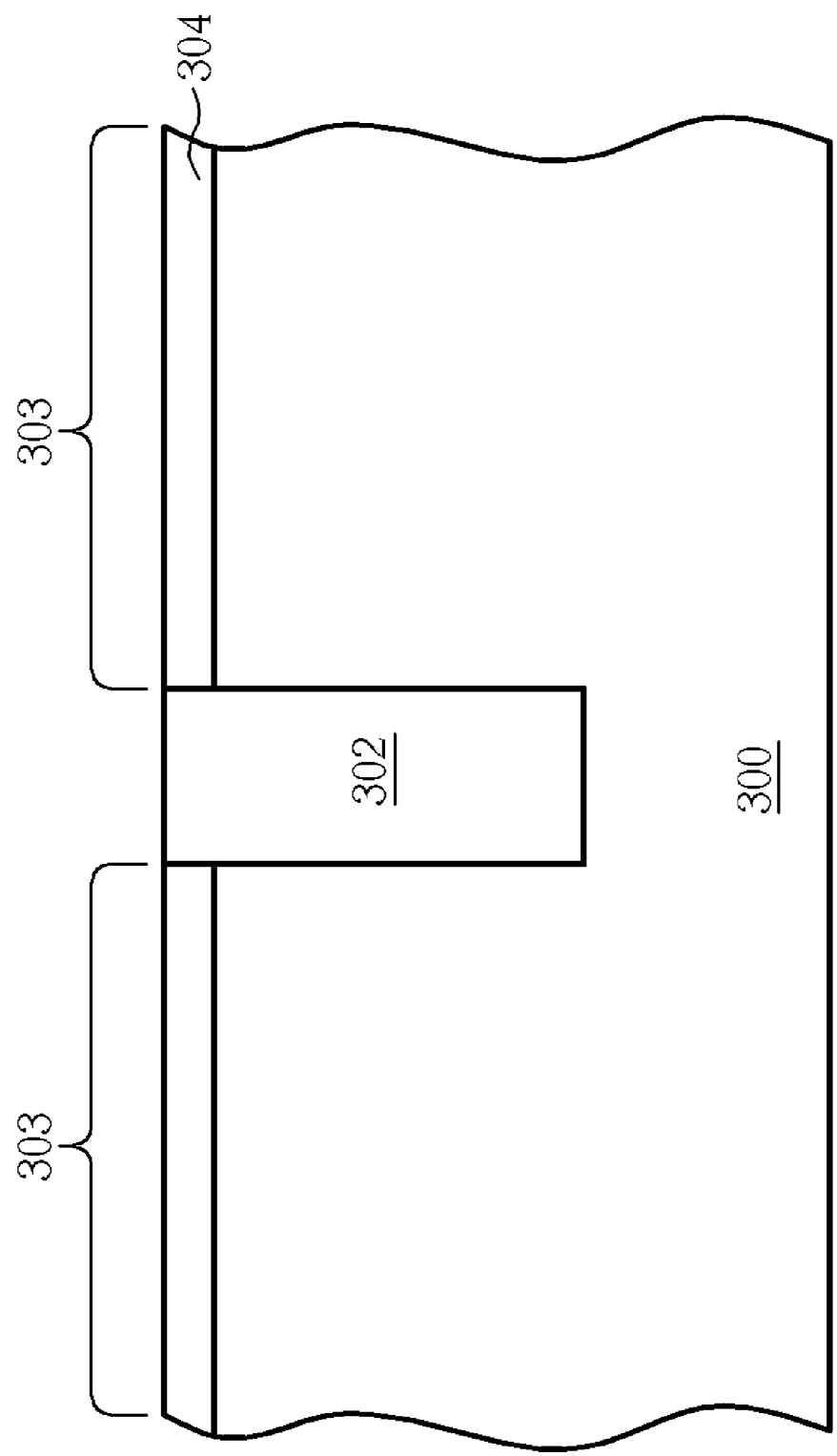
FIG. 5 is a cross-sectional diagram along the line 5-5' of the substrate shown in FIG. 4.

Please refer to FIGS. 4-13, which are the plain view and the schematic cross-sectional views illustrating a chip on which the trench capacitors are formed in according with the first preferred embodiment provided by the present invention. Please refer to FIGS. 4 and 5, wherein FIG. 5 is a cross-sectional diagram along the line 5-5' of the substrate shown in FIG. 4. First, a substrate 300 such as a P-type doped semiconductor substrate, a wafer, or a Silicon-on-Insulator (SOI) substrate is provided, on which has a grid shallow trench isolation (STI) 302 and a plurality of active region 303 defined and isolated by the STI 302. Wherein each active region 303 is covered by a hard mask layer 304 which is composed of a material such as silicon nitride. And each active region 303 arranges tightly along the X direction and Y direction. In addition, each active region 303 is a rectangular with its' long side parallel to the X direction.

Figure 6:
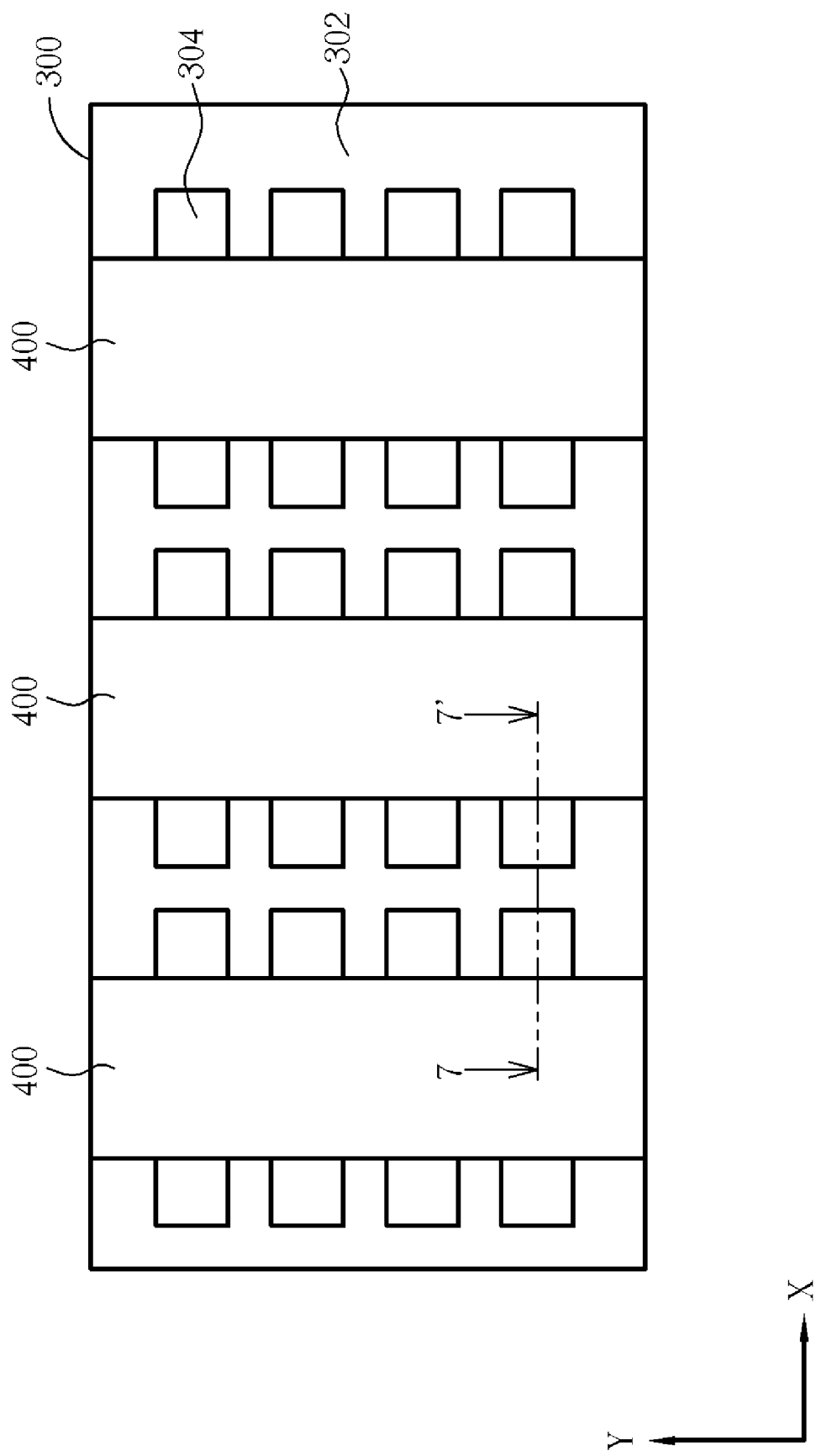
FIG. 6 is a plain view of a trench capacitor array in the present invention.
Figure 7:
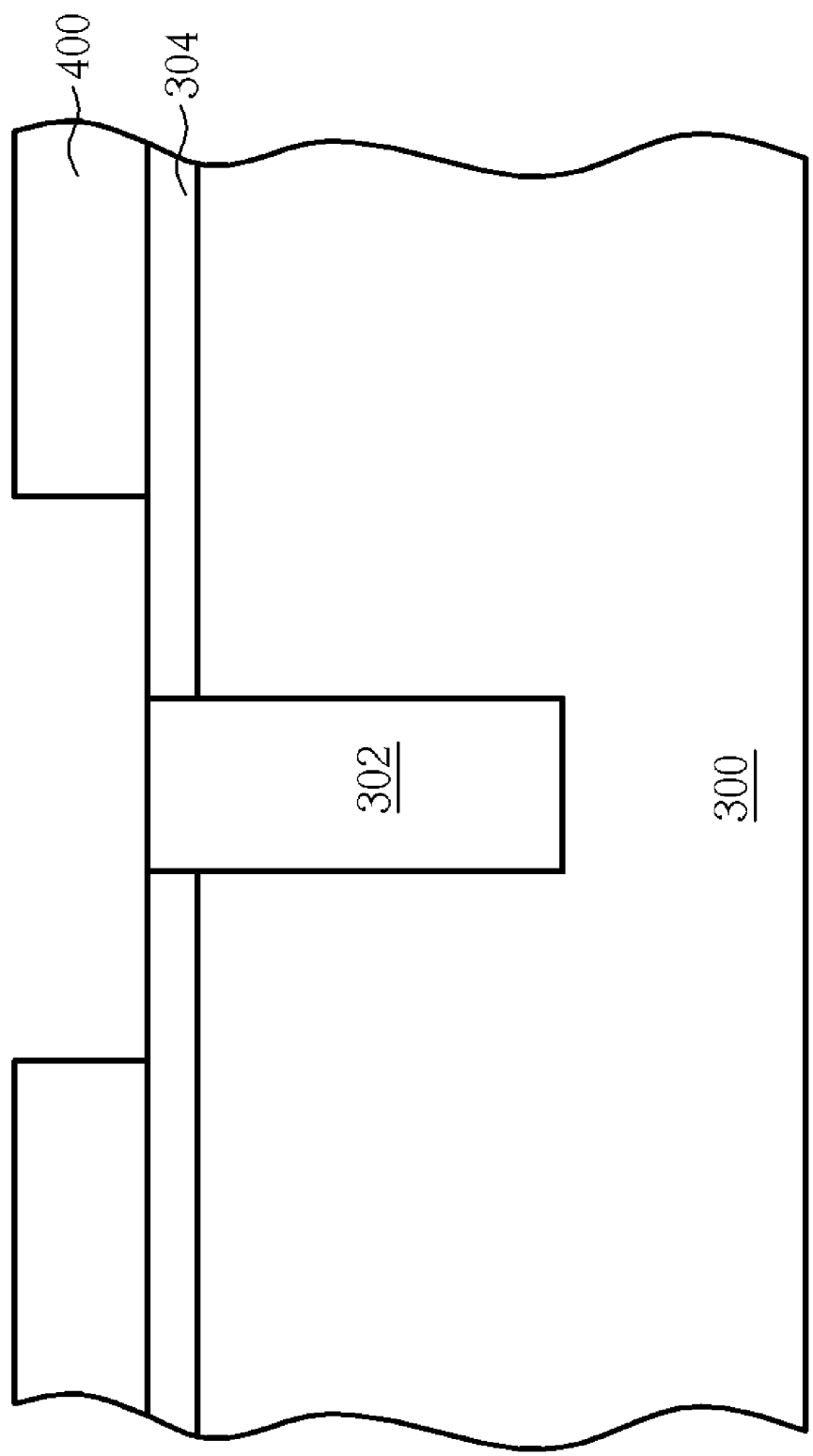
FIG. 7 is a cross-sectional diagram along the line 7-7' of the substrate shown in FIG. 6.

Please refer to FIG. 6-7, wherein FIG. 7 is a cross-sectional diagram along the line 7-7' of the substrate shown in FIG. 6. Next, by forming a photoresist, and performing the exposure, the development, and the curing processes on the substrate, a plurality of phtotresist strips 400 which parallel to each other is formed on the substrate 300's surface. The photoresisit strips 400 cover part of the STIs 302 and part of the hard mask layer 304 to define positions for two deep trenches respectively in two any adjacent regions 303.

What deserves to be mentioned is that due to the different etching ratio, the STI 302 composing of silicon oxide and the hard mask layer 304 composing of silicon nitride are used as the etching mask in the etching process in this embodiment. Therefore the trench array pattern is defined by a photo mask which does not require the high density in X direction and Y direction. In other words, according to the present invention, only a low grade photo mask requiring the alignment in X direction is needed to form a plurality of photoresist strips 400. And the photoresist strips 400 are arranged with its long side parallel to the Y direction. Co-operating with the grid STI 302 and the hard mask layer 304 arranging in array, one can define the positions for each deep trench by performing the active to trench self-align process.

As shown in FIG. 7, the photoresist strips 400 and the STI 302 are used as an etching mask in an etching process to remove the uncovered parts of the hard mask 304.

Figure 8:
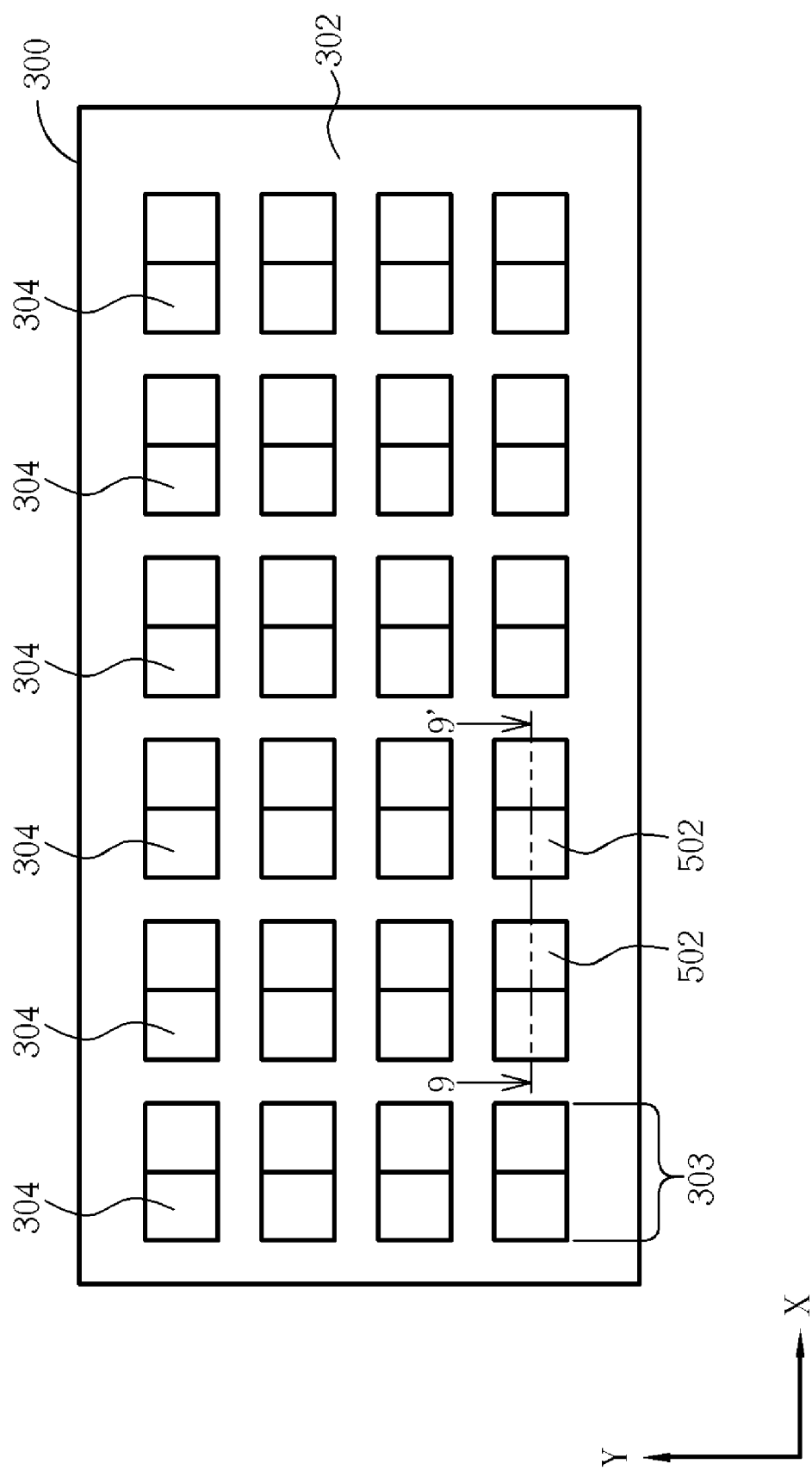
FIG. 8 is a plain view of a trench capacitor array in the present invention.
Figure 9:
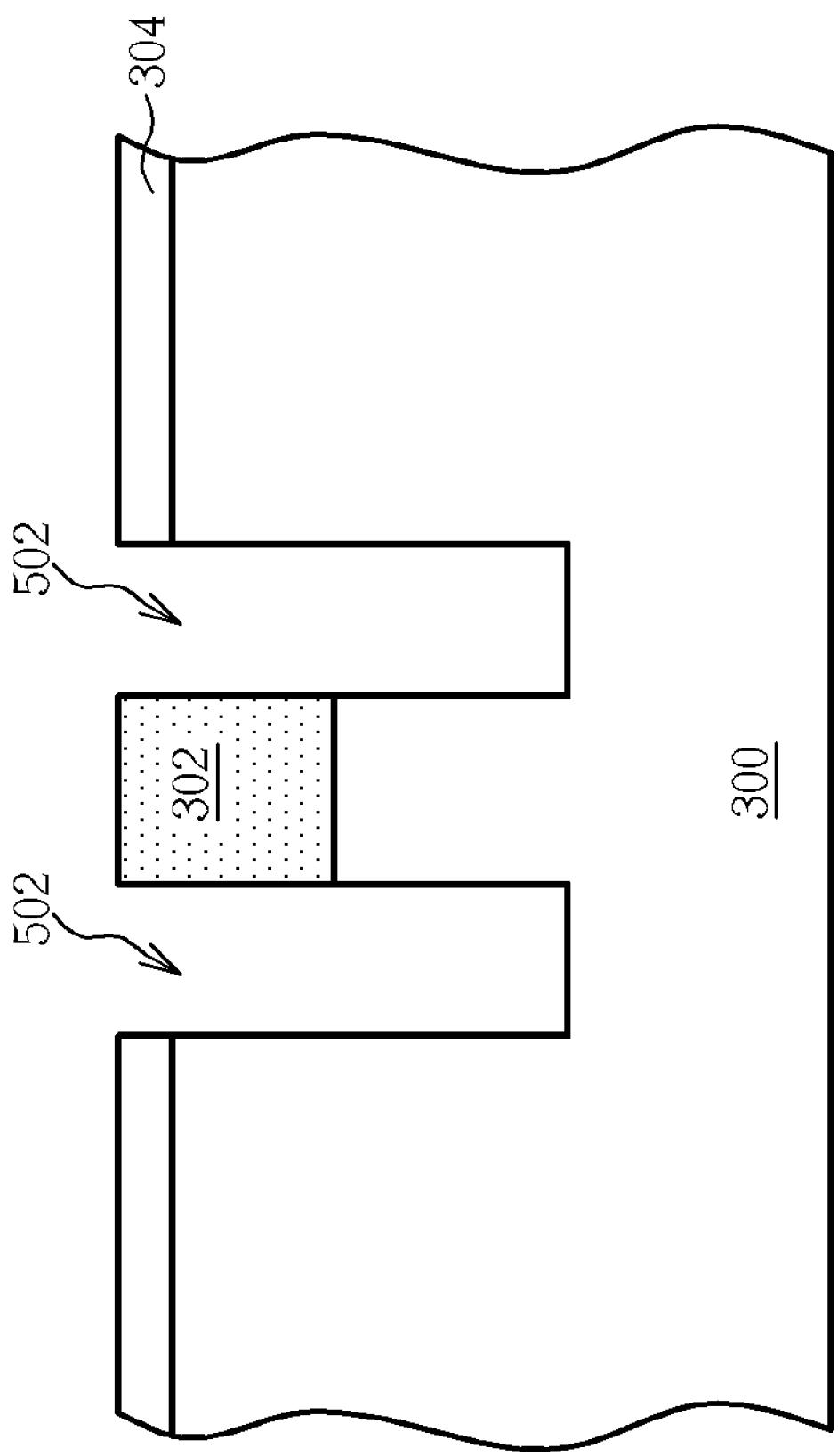
FIGS. 9-13 are cross-sectional diagram along the line 9-9' if the substrate shown in FIG. 7 in accordance with the first preferred embodiment of the present invention.

After removing the photoresist strips 400, please refer to FIGS. 8-9, wherein FIG. 9 is the cross-sectional diagram along the line 9-9' of the substrate shown in FIG. 8. As illustrated in FIG. 8-9, the STI 302 and the remained parts of the hard mask layer 304 are used as an etching mask in the etching process. A plurality of deep trenches is then formed respectively in each active region 303.

Figure 10:
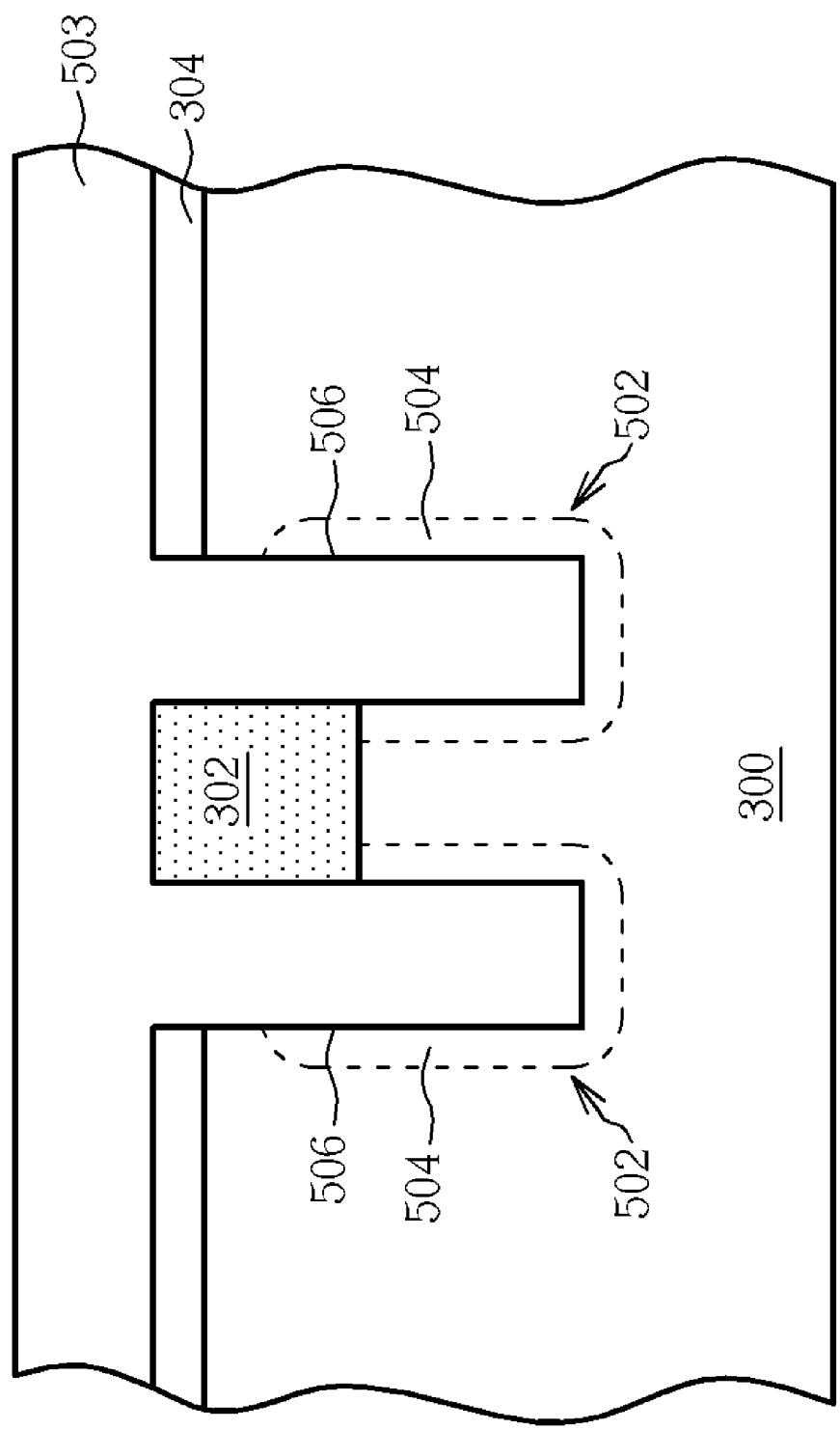

As shown in FIG. 10, an arsenic silicate glass (ASG) diffusion technique, a ion implanting or an oblique angle ion implanting process is performed. By doping heavily N-type ion within one of the processes, diffusion regions 504 are formed in the substrate 300 of sidewalls and the bottom in each deep trench. Then, using the deposition and thermal oxidation processes to form a capacitor dielectric layer 506 such as an oxide-nitride-oxide (ONO) dielectric layer, but not limited, in the surface of the sidewalls and the bottom in each deep trench. A polysilicon layer 503 is then filled in the deep trenches 502 and removed partly by the etching back or CMP process. The polysilicon layer 503 are removed to approximately lower than the hard mask layer 304 and the STI 302 to form capacitor bottom electrodes 508 in each deep trench 503 and complete the manufacturing of the trench capacitors.

Figure 11:
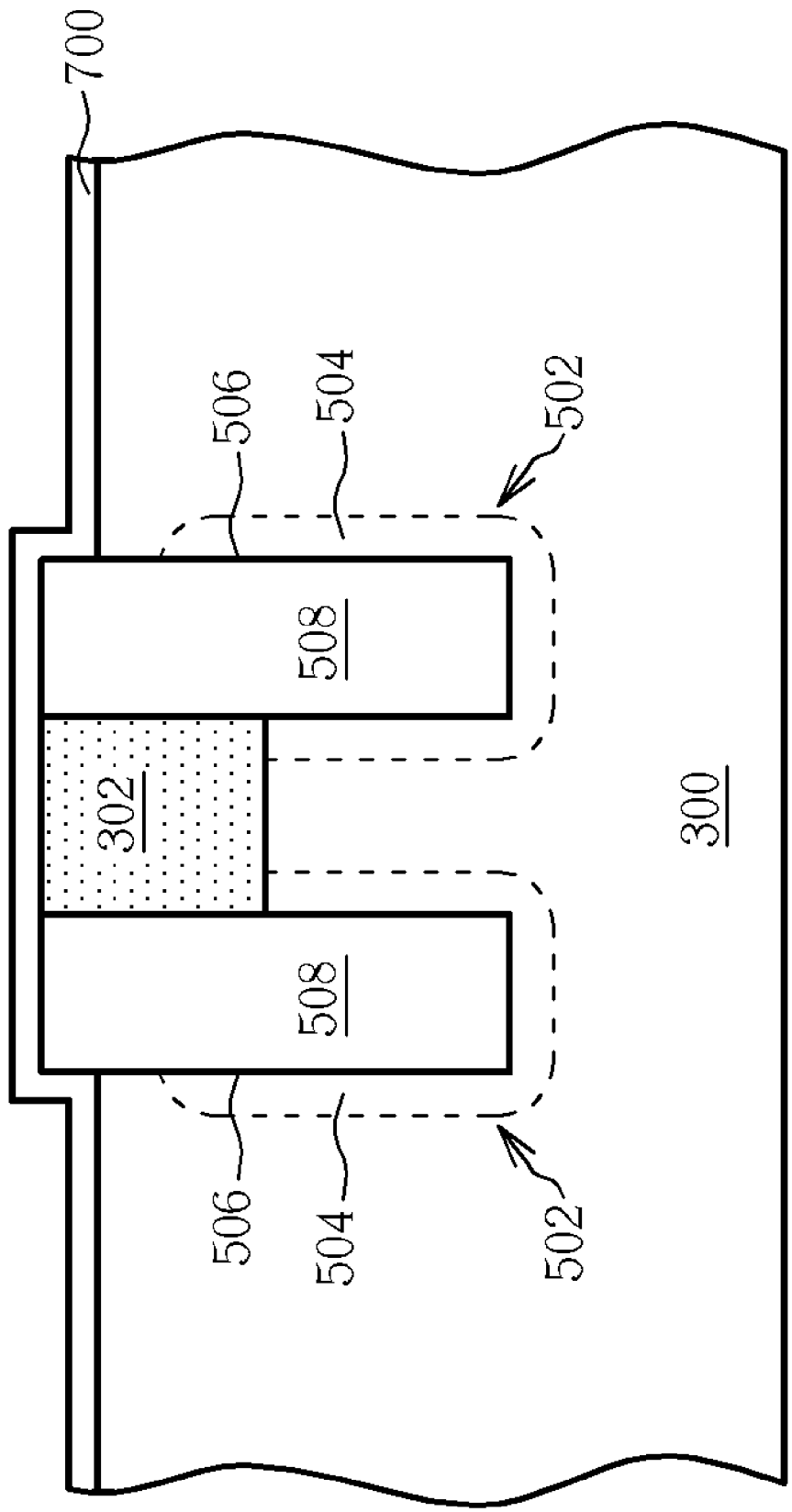

The present invention can also perform the process according to the product design, the process standard, and the demand for the electrical performance to form the corresponding horizontal MOS transistor or vertical MOS transistor and word lines which electrically connect to the trench capacitors respectively. It can also be modified to form the desired DRAM and the memory cells of the 1-Transistor Static Random Access Memory (1 T-SRAM). For example, after removing the hard mask layer 304, the standard logic process such as thermal oxidation or deposition is performed to form a gate oxide layer 700 on the exposed surface of the substrate 300 and the surface of capacitor bottom electrodes 508, as shown in FIG. 11.

Figure 12:
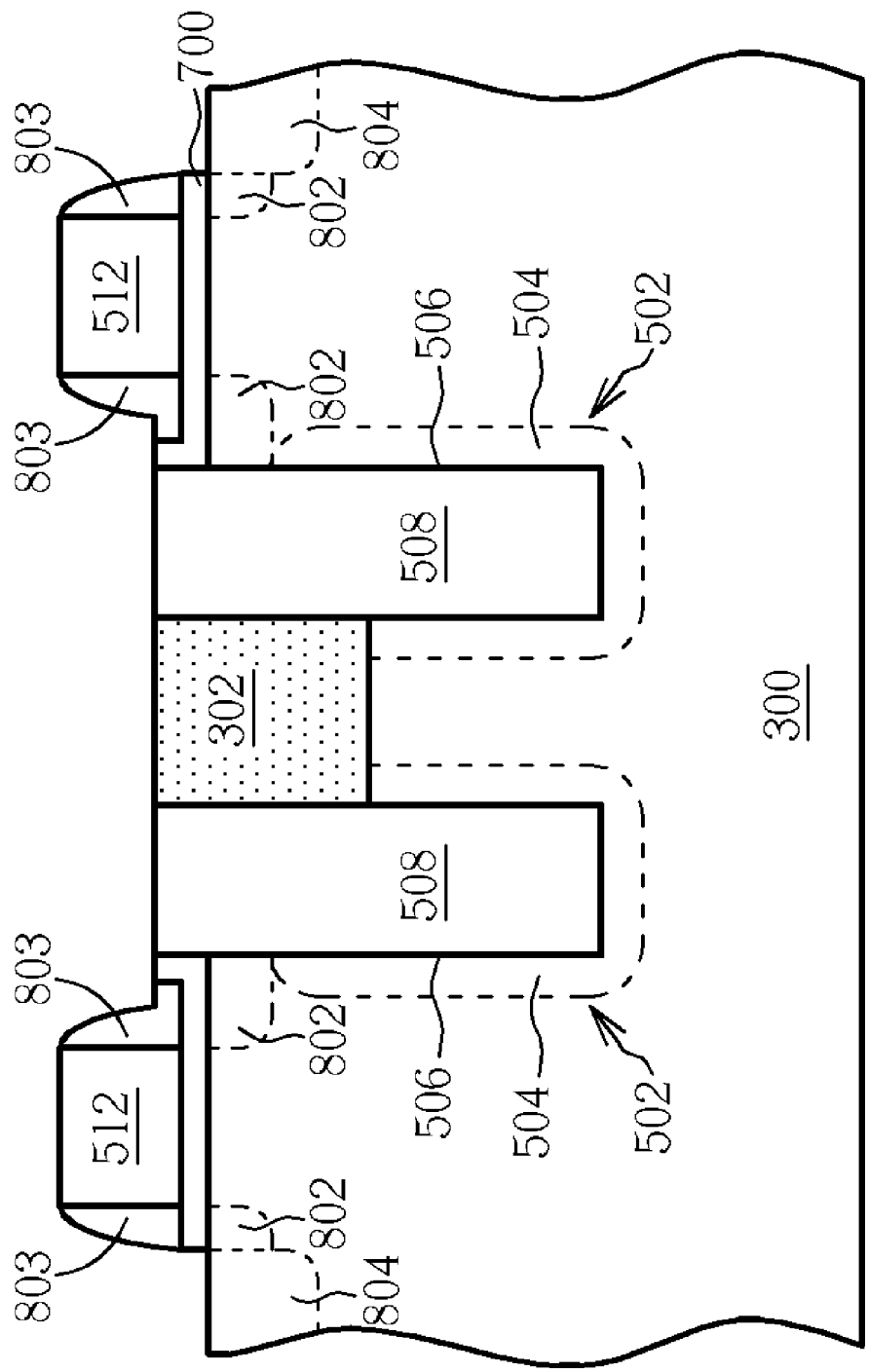
Figure 13:
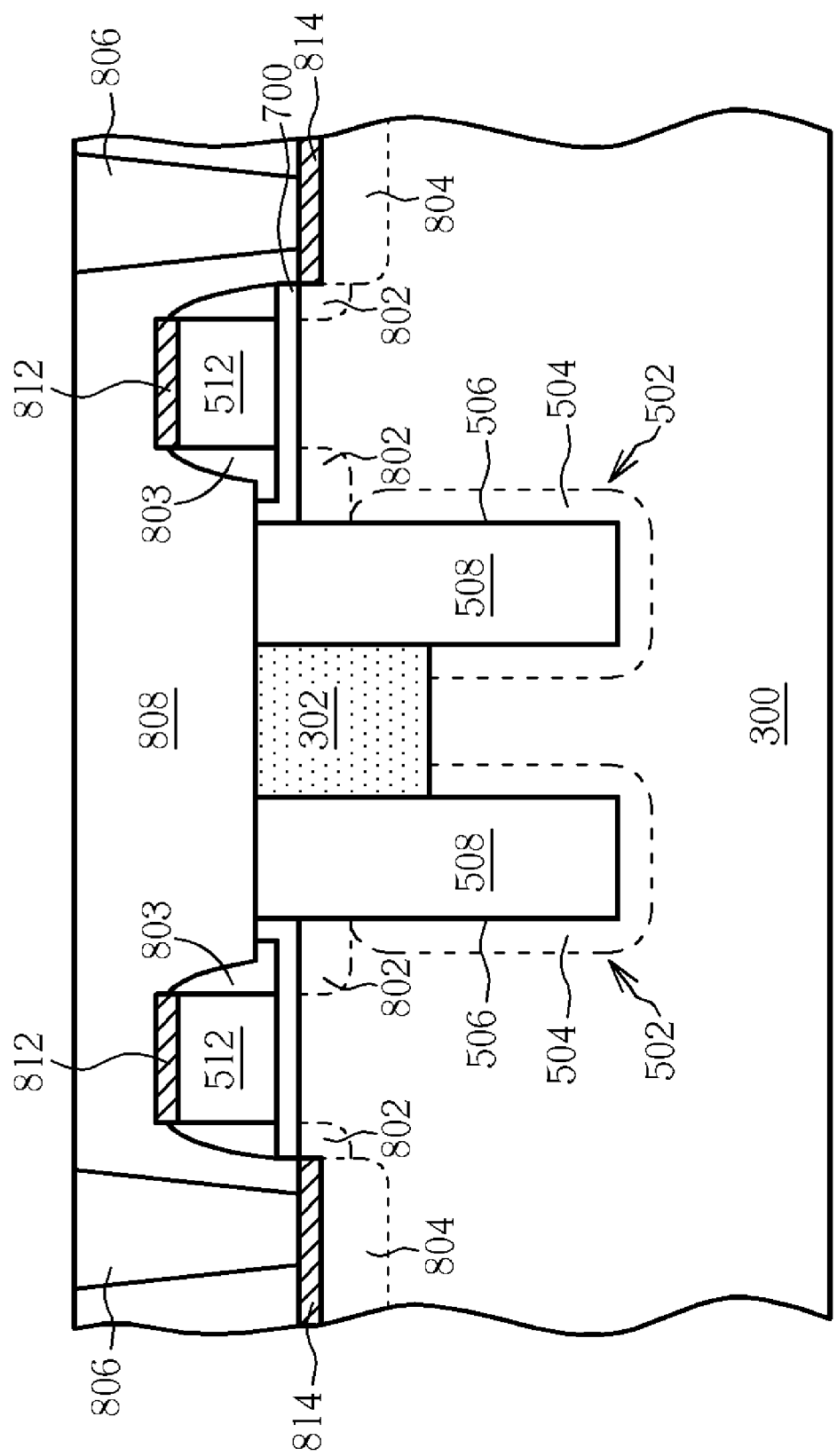

Please refer to FIG. 12, a polysilicon layer (not shown) is formed on the gate oxide layer 700 and is defined to a plurality of gate structures 512 by a photo-etching process (PEP). The gate structures 512 are used as masks in a lightly doped drain (LDD) process to form a plurality of LDD 802. Then a plurality of spacers 803 is formed and used as masks along with the gate structures 512 to form heavily doped source/drains 804. As shown in FIG. 13, by performing a salicide process with a salicide-blocked mask or an implant mask (not shown), salicide layers 812, 814 are formed. Please note that the salicide-blocked mask and the implant mask could be the same with the one used to exposure the photoresist 400 shown in FIG. 6. Having developed to this point, the trench capacitors of 1 T-SRAM are formed completely. The sources 804 are electrically connected to other circuit after forming an interlayer dielectric (ILD) layer 808 in which a plurality of bit line plugs is formed. For the steps illustrated in FIGS. 12-13 are obvious to those skilled in the art, so further details are omitted.

As described above, what worthy to be noted is the method provided by the present invention is not only used in forming the trench capacitors of DRAM, but also used in forming the trench capacitors of 1 T-SRAM. Please refer to FIGS. 14-18, which are the plain views and cross-sectional views illustrating the method according to the second embodiment of the present invention. The difference between the second embodiment and the first one as illustrated in FIGS. 4-13 is in the capacitor structure shown in FIG. 9, which resulted a continuous capacitor bottom electrodes of 2-Transistor and 2-Capacitor (2T-2C) memory cell.

Figure 14:
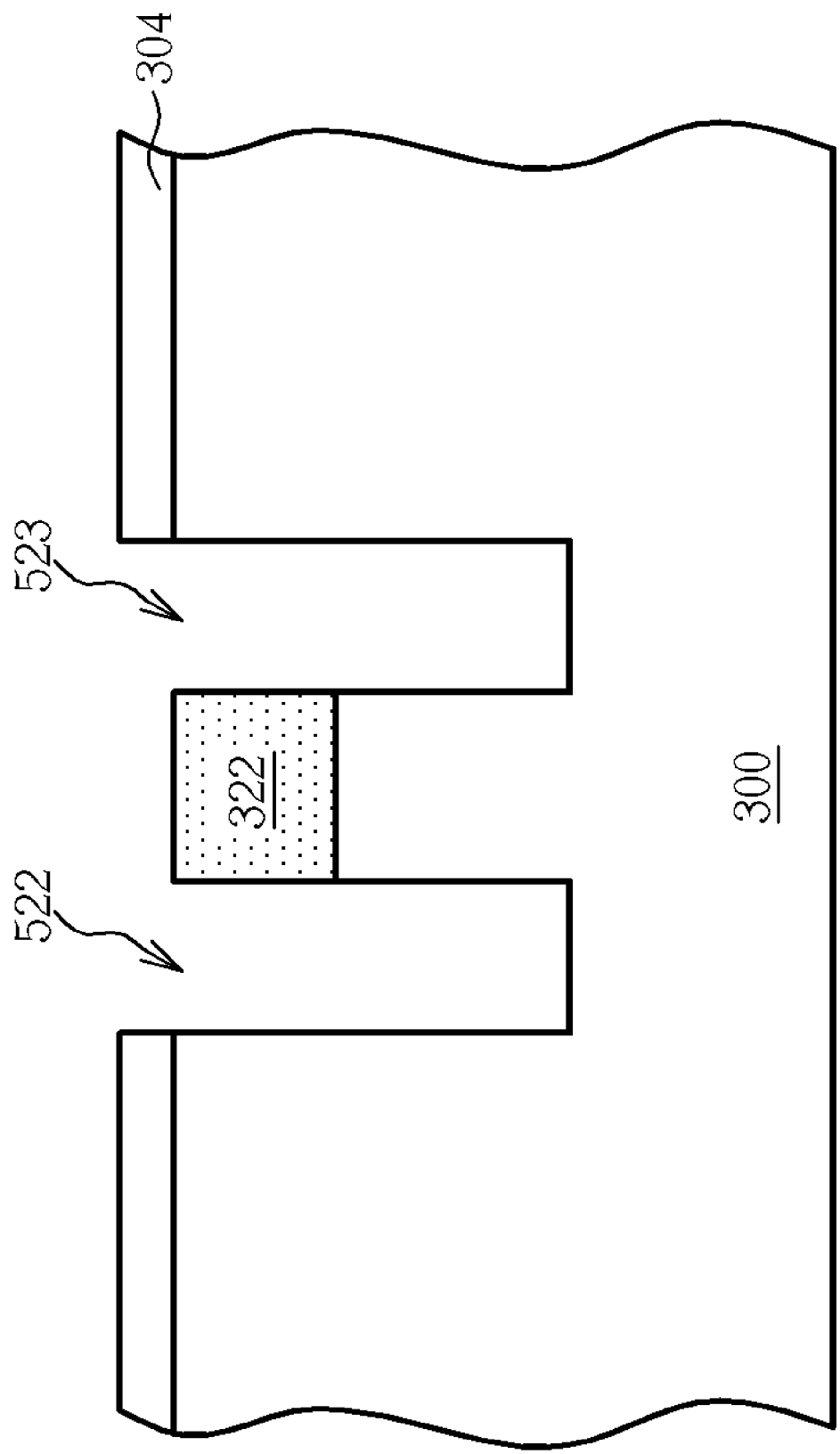
FIGS. 14-18 are cross-sectional diagram in accordance with the second embodiment of the present invention.

The steps performed in the second embodiment are the same as FIGS. 4-9, therefore only the steps illustrated after FIG. 9 are detailed. As shown in FIG. 14, after removing the photoresist 400, the STI 322 and the remained hard mask layer 304 are used as the etching mask to etch the substrate 300 and form a pair of deep trenches 522 and 523 respectively in a pair of adjacent active region 303. Please note that, in the etching process of the second embodiment, the etching parameter is adjusted to etch part of the STI 322 and the substrate 300 simultaneously. So the STI 322 is etched to the same height with the substrate 300 after forming the deep trenches 522 and 523.

Figure 15:
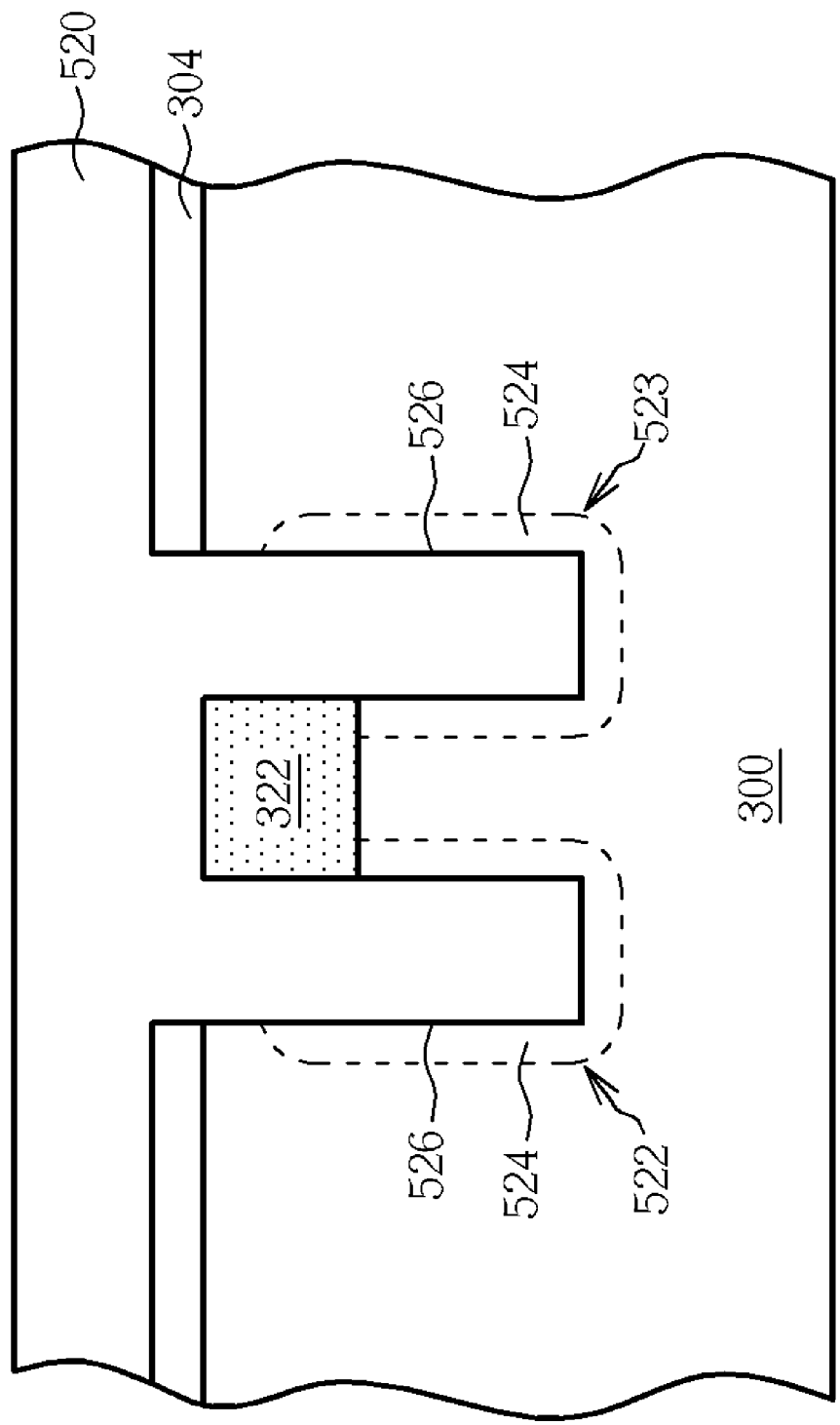

Please refer to FIG. 15, by performing an ASG diffusion technique, an ion implanting or an oblique angle ion implanting process, a heavily N-type doped diffusion region 524 is form in the substrate of the sidewalls and the bottom of the substrate 300. Then, using the deposition and the thermal oxidation processes to form a capacitor dielectric layer 526 such as an ONO dielectric layer, in the surface of the sidewalls and the bottom in the deep trenches 522 and 523. A polysilicon layer 520 is filled in the deep trenches 522 and 523 then removed partly by the etching back or CMP processes. However, the remained polysilicon layer still covers the STI 322 and form a continuous capacitor bottom electrode 528 in deep trenches 522 and 523. In other words, the capacitor bottom electrodes in each pair of trench capacitor along the Y direction are continuous structure.

Figure 16:
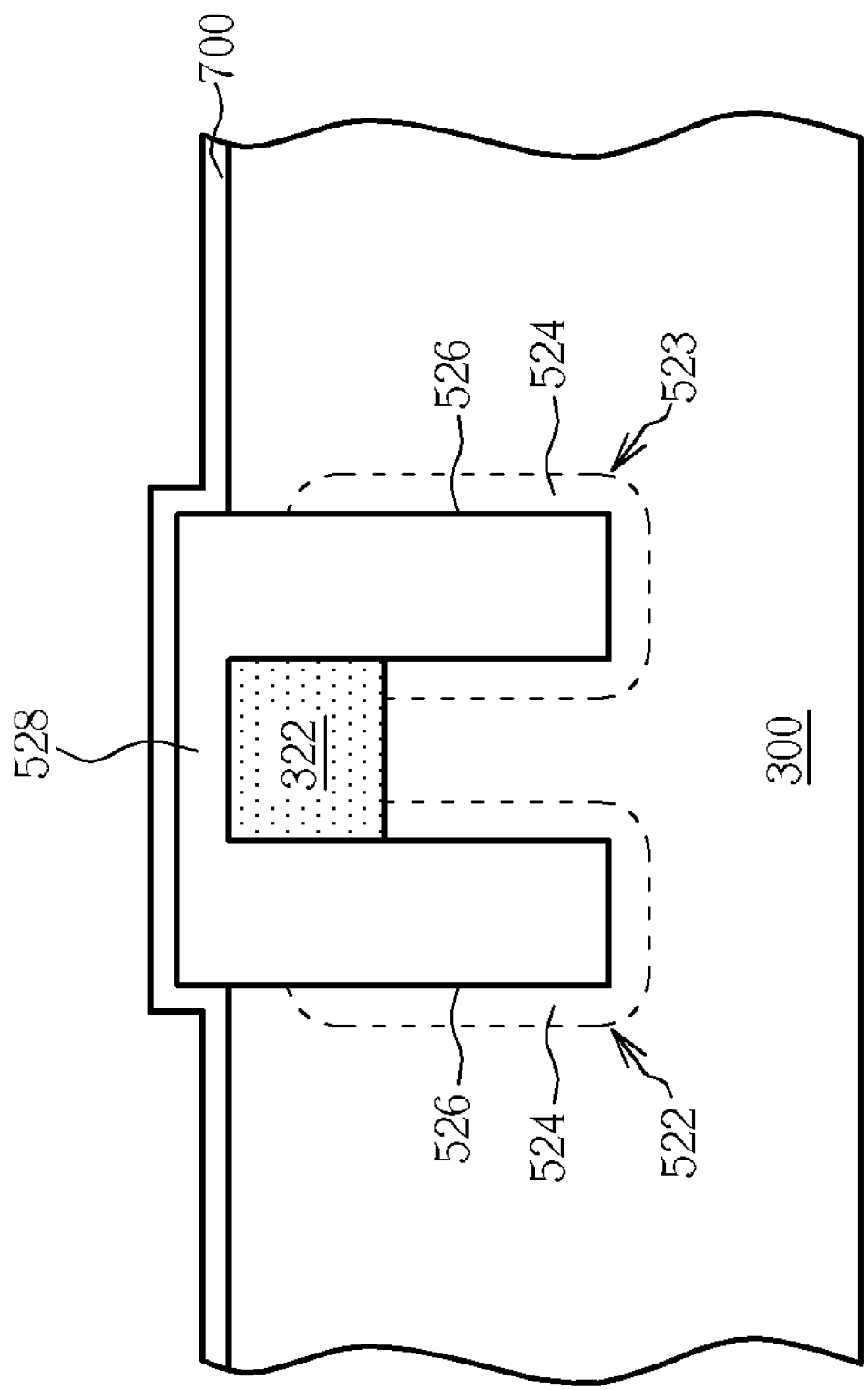

After removing the hard mask layer 304, the standard logic processes are performed, such as a thermal oxidation or a deposition, to form a gate dielectric layer 700 on the exposed surface of the substrate 300 and the exposed surface of the capacitor bottom electrode 528, as shown in FIG. 16.

Figure 17:
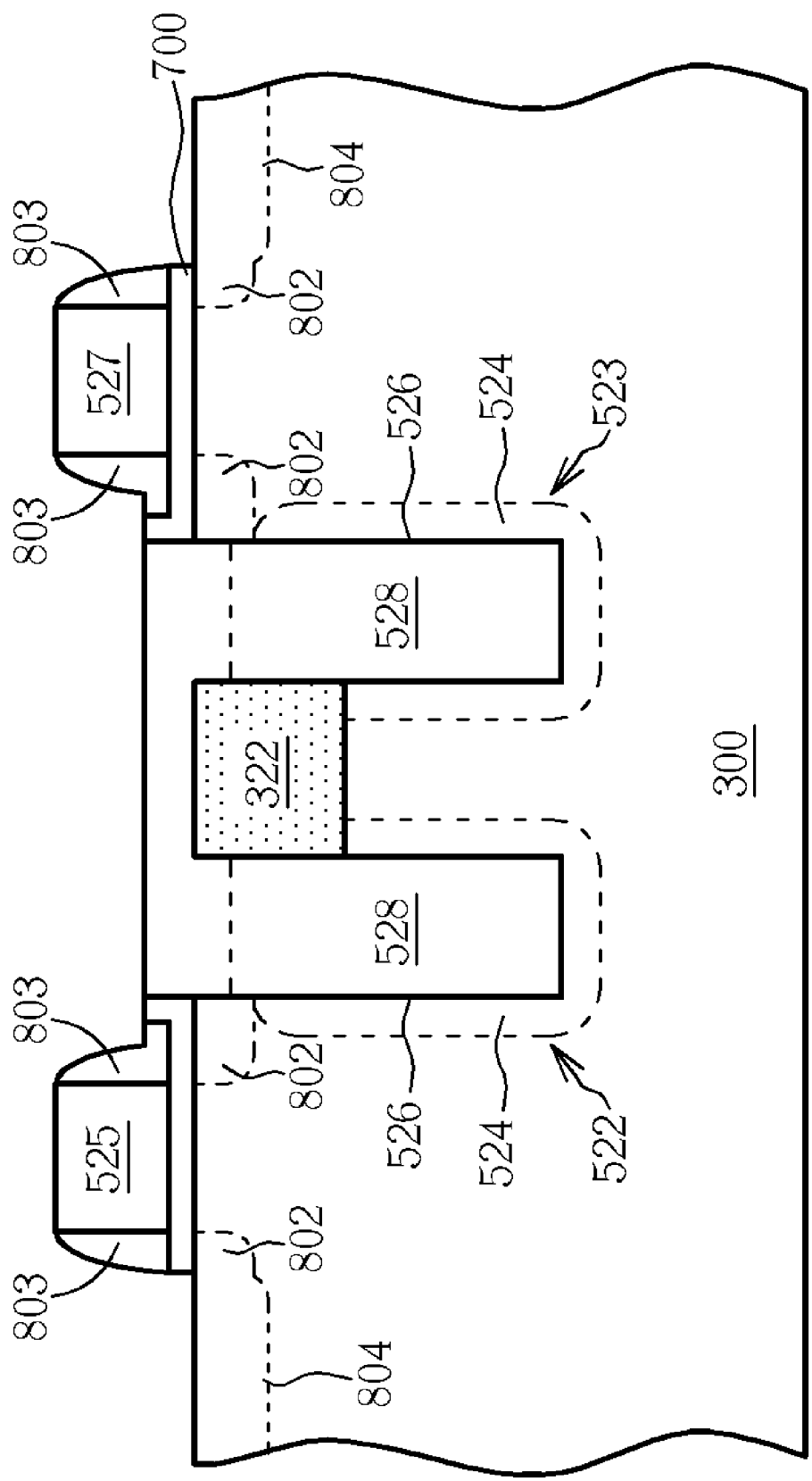

Pleaser refer to FIG. 17, a polysilicon layer (not shown) is formed on the gate oxide layer 700 and is defined to a plurality of gate structures 525 and 527 by a PEP. The gate structures 525 and 527 are used as mask in a lightly doped drain (LDD) process to form a plurality of LDD 802. Then a plurality of spacers 803 is formed and used as masks along with the gate structures 525 and 527 to form heavily doped source/drains (HDD) 804. In addition, the HDD process is also performed on the surface of the capacitor bottom electrode 528, which covers the STI 322.

Figure 18:
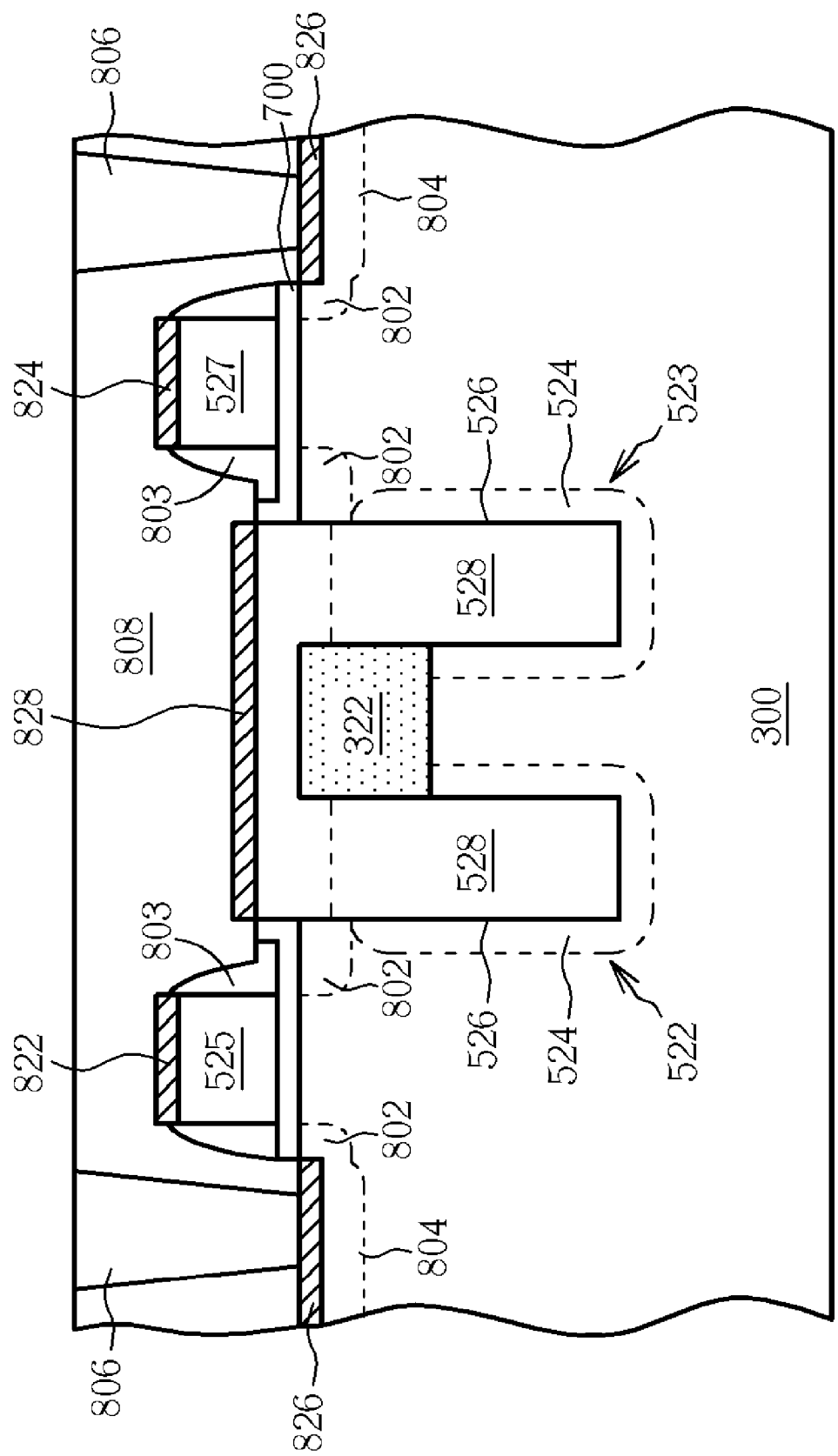

As shown in FIG. 18, by performing a salicide process, a salicide layer 822, 824, 826, and 828 are formed respectively on the gate structures 525 and 527, the sources/drains 804, and part of the surface capacitor bottom electrode 528 which covers the STI. Having developed to this point, the 2T-2C memory cells are formed completely. The sources 804 are electrically connected to other circuit after forming an interlayer dielectric (ILD) layer 808 in which a plurality of bit line plugs is formed. For the steps illustrated in FIGS. 17-18 are obvious to those skilled in the art, so further details are omitted.

Compared with prior art, the method provided by the present invention need a low grade photo mask only considers the X direction when used to define the photoresist. The defined photoresist strips are arranged with its long side parallel to the Y direction. The photoresist strips co-operate with grid STI and the hard mask layer which arranged in an array to define the positions for each deep trenches. In other words, it provides a method using active region to trench self-align to define and etch the deep trenches of the trench capacitor. Furthermore, in the prior art, there are two photo masks needed in the processes: one has an array pattern to define the positions for each deep trench, and the other also has an array pattern to define the positions for each STI. The present invention provides a method avoids using two photo masks which have high density demand in X and Y directions therefore decreases the possibility of fail in exposure and development therefore increases the process yield rate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming memory cells comprising:
providing a substrate on which has a grid shallow trench isolation (STI) and a plurality of active regions isolated by the STI, wherein the active regions are covered by a hard mask layer;
forming a plurality of photoresist strips parallel to each other on part of the hard mask layer to define positions for deep trenches of a trench capacitor in any adjacent two active regions;
performing an etching process with the STI and the hard mask layer used as an etching mask to etch the substrate and form the deep trenches respectively in the active region, wherein the STI are etched to the same height with the substrate;
forming diffusion regions in the substrate of the sidewalls and the bottom in each deep trench;
forming a capacitor dielectric layer on the surface of the sidewalls and the bottom in each deep trenches;
forming capacitor bottom electrodes covering the STI between a pair of adjacent active regions in each deep trenches whereby a continuous structure is formed; and
forming a plurality of transistors electrically connected to the capacitors on the substrate.

2. The method for forming memory cells of claim 1, wherein in the active region are rectangular and arranged tightly with the long sides parallel to an X direction.

3. The method for forming memory cells of claim 1, wherein the hard mask layer includes a silicon nitride layer.

4. The method for forming memory cells of claim 1, wherein the photoresist strips are defined by a low grade photo mask only has an X direction consideration.

5. The method for forming memory cells of claim 1, wherein the photo mask includes a salicide-blocked mask or an implant mask.

6. The method for forming memory cells of claim 1, wherein the etching mask further including the photoresist strips.

7. The method for forming memory cells of claim 1, wherein the cell comprising the pair of adjacent active regions and a STI between the pair of active regions.

8. The method for forming memory cells of claim 1, further comprising a heavily doped drain (HDD) process to form sources/drains of the transistors and a doped region on the top surface of the capacitor bottom electrode covers the STI.

* * * * *